Figure 1:
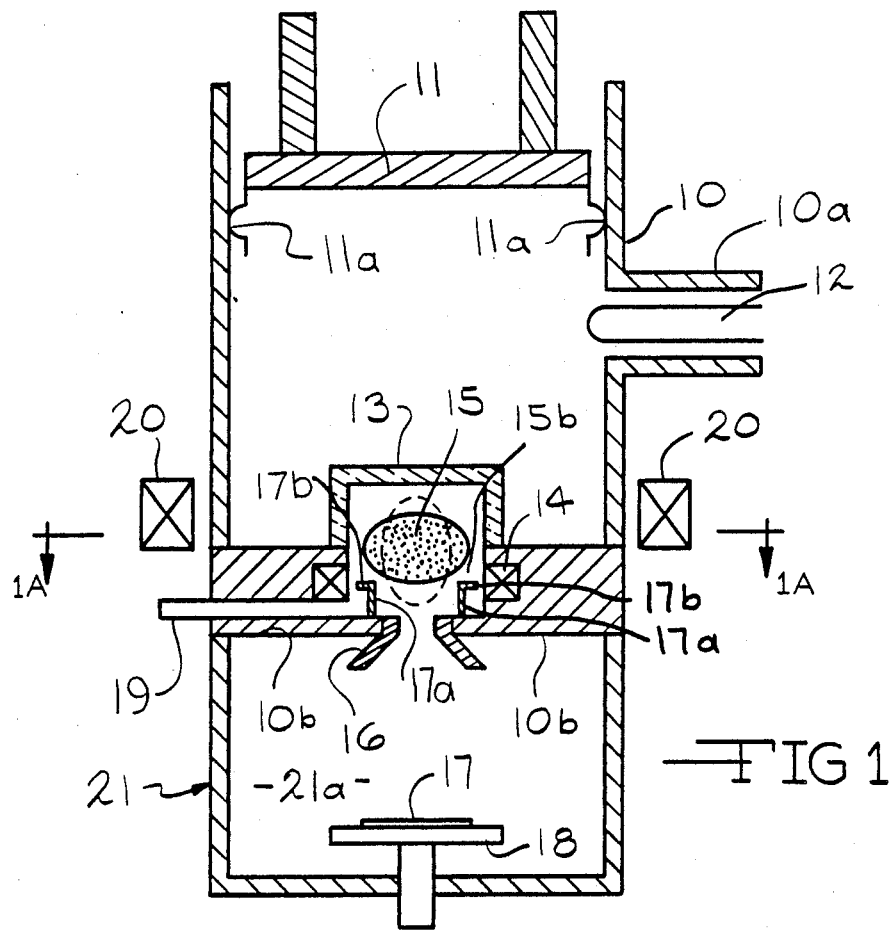

United States Patent [19]

Asmussen et al.

[11] Patent Number: 4,943,345
[45] Date of Patent: Jul. 24, 1990

[54] PLASMA REACTOR APPARATUS AND METHOD FOR TREATING A SUBSTRATE

[75] Inventors: Jes Asmussen, Okemos; Donnie K. Reinhard, East Lansing, both of Mich.

[73] Assignee: Board of Trustees operating Michigan State University, East Lansing, Mich.

[21] Appl. No.: 328,017

[22] Filed: Mar. 23, 1989

[51] Int. Cl.⁵ .......................... B44C 1/22; B05D 3/02
[52] U.S. Cl. .................................. 156/643; 118/50.1; 118/620; 118/728; 156/345; 204/192.1; 204/192.32; 204/298.08; 427/38; 427/45.1
[58] Field of Search .......................... 427/12, 38, 45.1; 118/50.1, 620, 623, 728; 156/345, 643, 646; 219/121.41, 121.43, 121.44, 121.5, 121.51, 121.58, 121.59, 121.55; 204/192.1, 192.12, 192.32, 298

[56] References Cited

U.S. PATENT DOCUMENTS

| | | | |
|---|---|---|---|
| 4,581,100 | 4/1986 | Hatzakis et al. | 204/298 X |
| 4,664,747 | 5/1987 | Sekiguchi et al. | 156/345 X |
| 4,718,976 | 1/1988 | Fujimura | 156/345 X |
| 4,831,963 | 5/1989 | Saito et al. | 204/298 X |

*Primary Examiner*—William A. Powell
*Attorney, Agent, or Firm*—Ian C. McLeod

[57] ABSTRACT

An apparatus and method for treating a substrate with an excited species removed from a plasma (15, 15a, 31, 52, 53) is described. The apparatus includes closed or open end tubes (13, 22, 30, 54 and 55) with apparatus or nozzles (16, 32, 56 and 57) for directing the excited species at a substrate (17, 33, 59) and a tunable plate or sliding short (11, 38, 39, 40) internal or external of the tubes for positioning the plasma in the tube during operation of the apparatus. Tuning or nozzle position or power variations are used. The method and apparatus is useful for depositing films, etching and the like.

38 Claims, 8 Drawing Sheets

PLASMA REACTOR APPARATUS AND METHOD FOR TREATING A SUBSTRATE

BACKGROUND OF THE INVENTION

(1) Field of the Invention

The present invention relates to an improved plasma reactor apparatus, preferably with a tunable and electrodeless radiofrequency wave cavity around a confined space for the plasma, and to a method wherein the apparatus and method are used for treating a substrate with an excited species from the plasma in a reaction chamber spaced from the confined space for the plasma and separated by an aperture or restricted opening through which the plasma passes. In particular the present invention relates to an apparatus wherein the position of the plasma in the confined space is controlled by various means during operation of the apparatus.

(2) Prior Art

Asmussen et al U.S Pat. Nos. 4,507,588; 4,585,668; 4,727,293; 4,630,566; and 4,691,662 describe methods and apparatus for the generation of an electrodeless disk shaped plasma. The method and apparatus of these patents work very well and are utilized in the present invention, as are the more conventional plasmas formed in elongate quartz tubes as shown in Proceedings of the IEEE 62, 109-117 (1974).

The above referenced patents and publication describe the prior art in great detail. In all of this prior art, a sliding short or other tuning means is used to tune microwaves or other radiofrequency waves in a cavity around the plasma confining means. The sliding short is external of the plasma confining means which is non-metallic and transparent to the radiofrequency waves (e.g. quartz). Usually the radiofrequency waves are tuned in the cavity so that the reflected power is zero so that the microwaves are resonant and matched in the cavity. Also, radiofrequency waveguides can be used. In this case, the microwaves are propagating in the waveguide. There is an incident wave and a wave is reflected at the plasma discharge. In contrast, a cavity applicator has a resonant standing wave (higher Q) wave incident on the plasma discharge.

In J. of Propulsion and Power 3, 136-144 (1987) and Applied Physics Lett. 44, 1014-1016 (1984) a propulsion device is described. The apparatus includes a nozzle which is used to develop the thrust using a low molecular weight gas ($N_2$ or He) at high pressures. There was no mention of the device for any materials processing.

One important use of plasmas is in diamond or diamond-like thin film deposition. Such plasma deposition is described for instance in Cann U.S. Pat. Nos. 4,471,003, 4,682,564 and 4,487,162; Aisenberg U.S. Pat. No. 3,961,103; Venkataramanan et al U.S. Pat. No. 4,647,512; Carlson et al U.S. Pat. No. 4,060,660; Ovshinsky et al U.S. Pat. No. 4,663,183; Etzkorn et al U.S. Pat. No. 4,728,529 and in Kamo et al U.S. Pat. No. 4,434,188 to produce such films. Some of these patents describe plasmas created by DC arc electrodes which contaminate the coating or the like on the substrate. The electrodes also decrease operating life and increase maintenance. Also Kurihara et al Appl. Phys. Lett 52: 437-438 (1988) describe the use of DC arc plasmas for this purpose. Kamo et al describe an electrodeless plasma apparatus which is an improvement. Also, Kamo et al (M. Kamo, Y. Sato, S. Matsumoto, and N. Setaka, Journal of Crystal Growth 62, 642-644 (1983)) show a representative apparatus. Hydrogen and methane are fed into a quartz tube which also contains a substrate on which the diamond film is to be formed. Microwave energy at 2.45 GHz is transmitted to the chamber through a waveguide in order to form a microwave plasma inside the quartz tube. Film growth on the substrate results from chemical vapor deposition as the methane is dissociated into radicals and ions of C and H. With this apparatus, diamond particles were formed on silicon wafers under conditions of 1 to 3% methane, 300 to 700 W of microwave power, and total pressures of approximately 10 to 100 Torr. The substrate reached temperatures of 800° to 1000° C. There is a need for a method and apparatus which is electrodeless and which can produce a diamond or diamond-like coating over a large surface area at high deposition rates.

Matsumoto et al U.S Pat. No. 4,767,608 describes the use of plasmas provided through apertures for depositing diamond thin films. No adjustment of the position or size of the plasma relative to the aperture during operation of the apparatus is described. As a result the apparatus is not as versatile and thus can not be adapted to a wide range of processing conditions.

The properties of diamond include an extremely high degree of hardness, a very high thermal conductivity, optical transparency, high electrical resistivity, and semiconductivity induced by doping with trace levels of impurities. The following is a partial list of diamond film applications: lens coating; laser windows; tribology applications (hard surfaces, long wearing bearings, etc.); electronic packaging and passivation; thermal heat sinks; electrical isolation; high temperature electronic devices; microwave and mm wave power devices; and low noise UV detectors. This unusual combination of properties makes the production of such films highly desirable and a preferred product of the present invention.

OBJECTS

Therefore, it is an object of the present invention to provide a method and apparatus for treating substrates with excited species from a plasma. It is further an object of the present invention to provide a method and apparatus wherein films or coatings, for example diamond thin films, can be deposited rapidly and with homogeneity on a large surface. Further still it is an object of the present invention to provide a method which is easy to perform and an apparatus which is simple and economical to construct and operate. These and other objects will become increasingly apparent by reference to the following description and the drawings.

IN THE DRAWINGS

FIG. 1 is a schematic front cross-sectional view of a plasma reactor apparatus wherein the plasma 15 is confined in a cylindrically cross-sectioned quartz closed end tube 13 adjacent a nozzle 16 and wherein a substrate 17 is mounted on an optionally heated support 18 in a reaction chamber 21 and further showing a sliding short 11 for positioning the plasma 15 during operation of the apparatus.

Figure 1A:
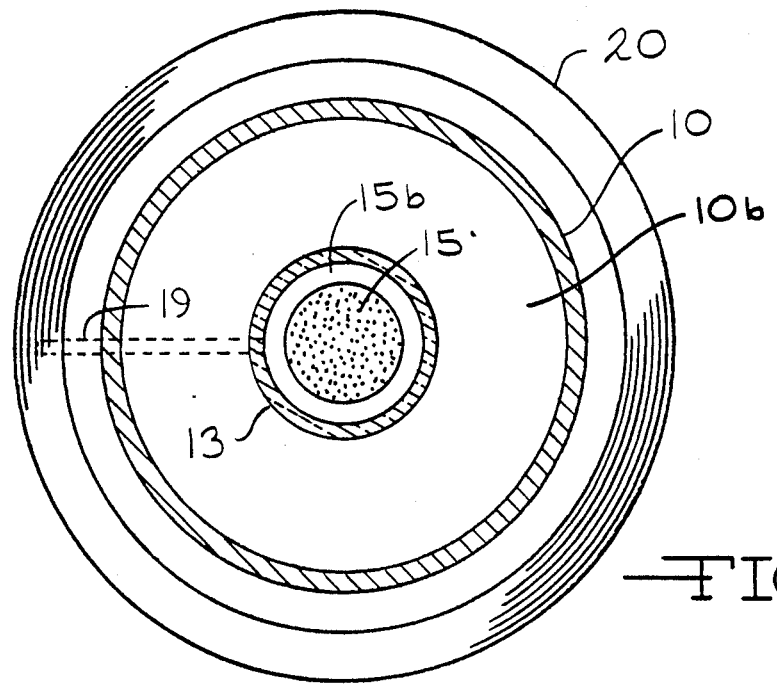

FIG. 1A is a cross-section along line 1A—1A of FIG. 1.

Figure 2:
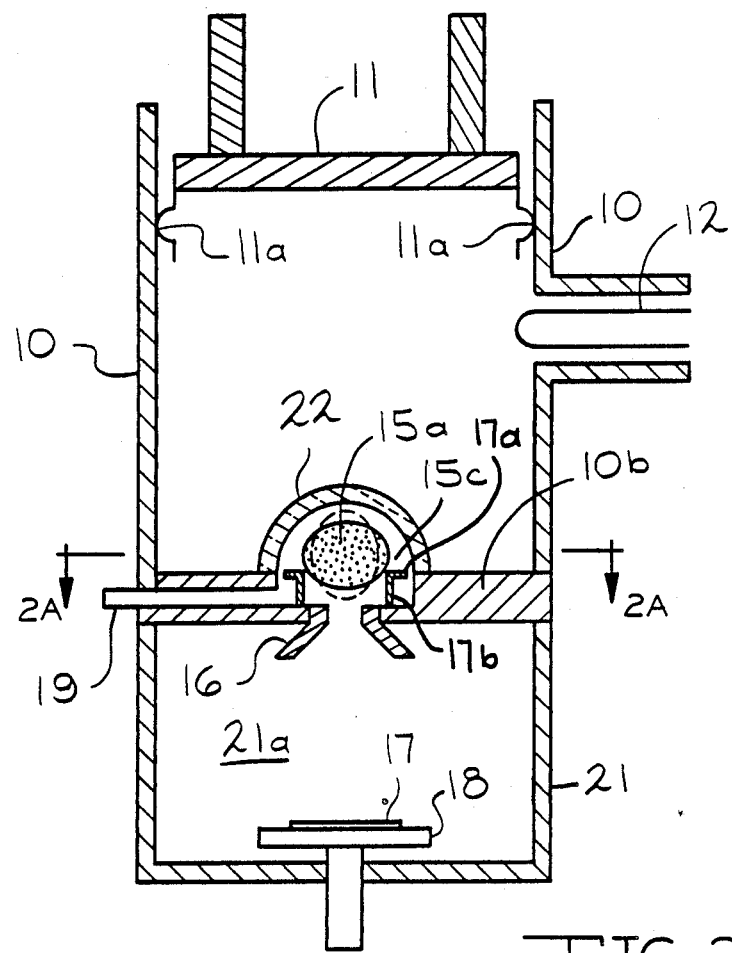
Figure 2A:
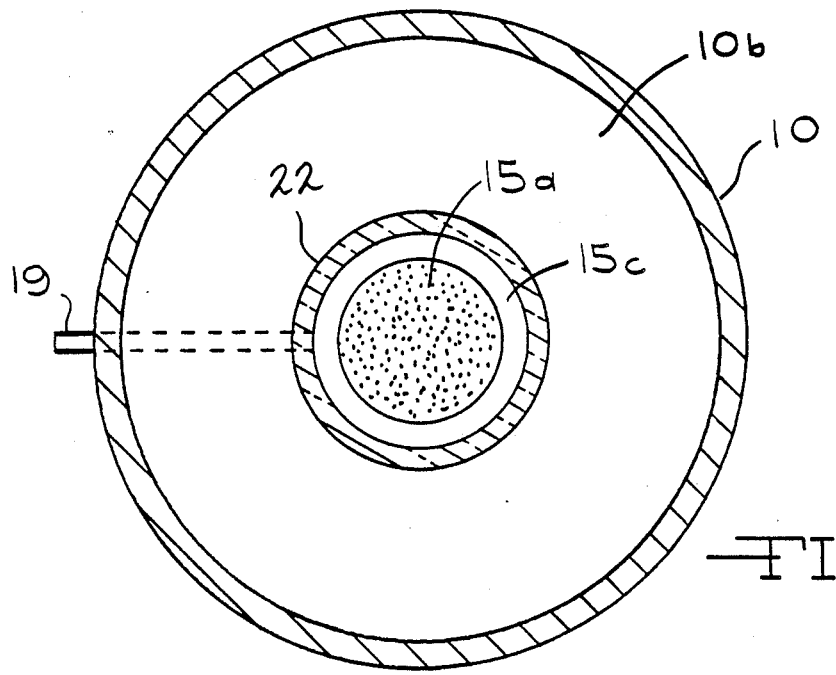

FIG. 2 is a schematic front cross-sectional view of a plasma reactor apparatus showing the use of a quartz hemisphere 22 for confining the plasma 15a adjacent the nozzle 16 and wherein a substrate 17 is mounted on the support 18 in the reaction chamber 21 and further showing a sliding short 11 for positioning the plasma 15a during operation of the apparatus. FIG. 2A is a cross-sectional view along line 2A—2A of FIG. 2.

Figure 3:
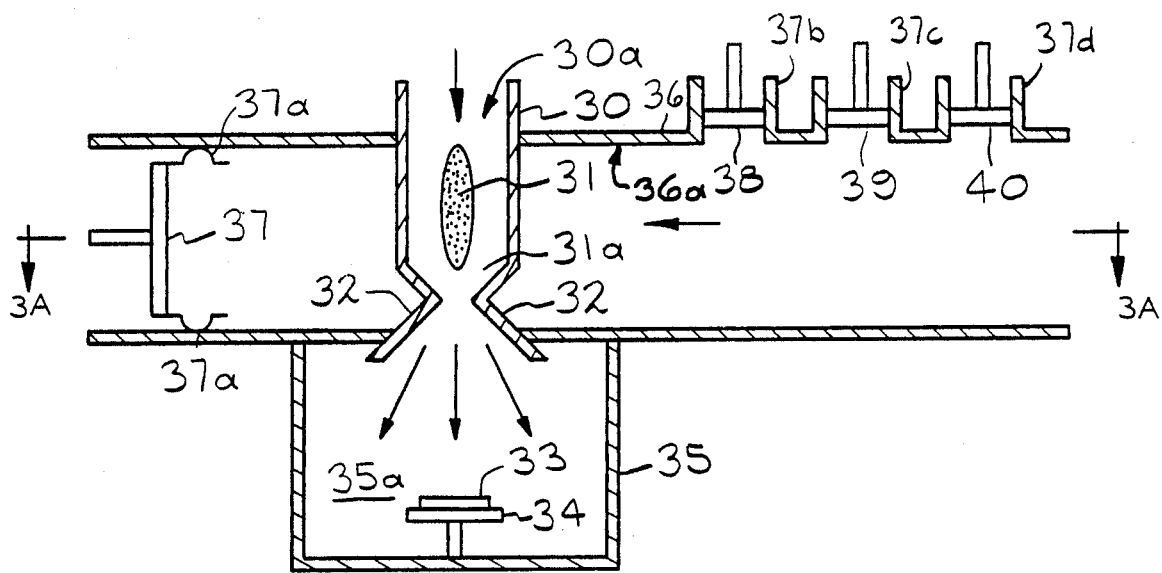
Figure 3A:
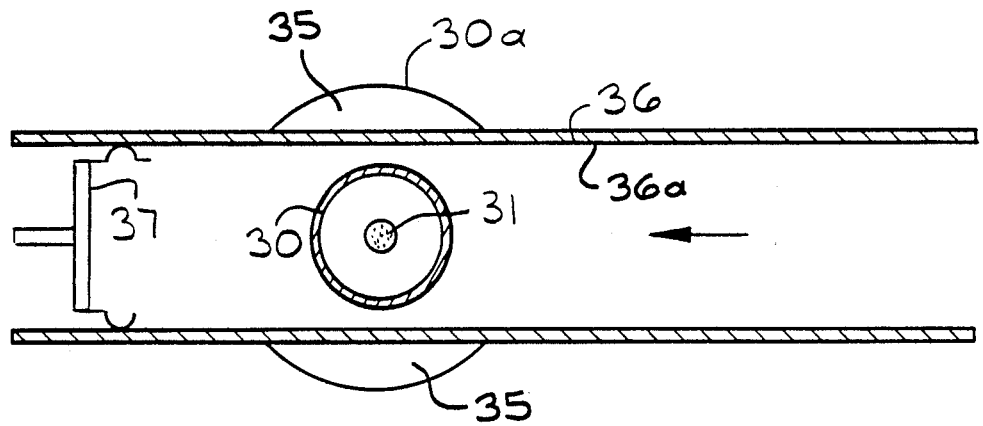

FIG. 3 is a schematic front cross-sectional view of a plasma reactor apparatus showing a quartz tube 30 which confines the plasma 31 adjacent a nozzle 32 and wherein a substrate 33 is mounted on a support 34 in a reaction chamber 35 and further showing a sliding short 37 for tuning the plasma 31 during operation of the apparatus. FIG. 3A is a cross-sectional view along line 3A—3A of FIG. 3.

Figure 4:
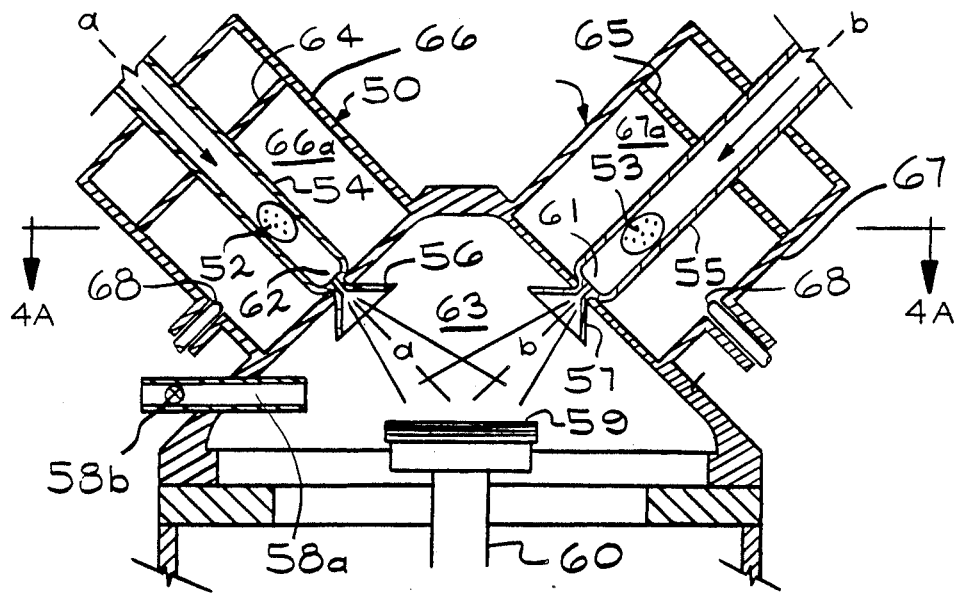
Figure 4A:
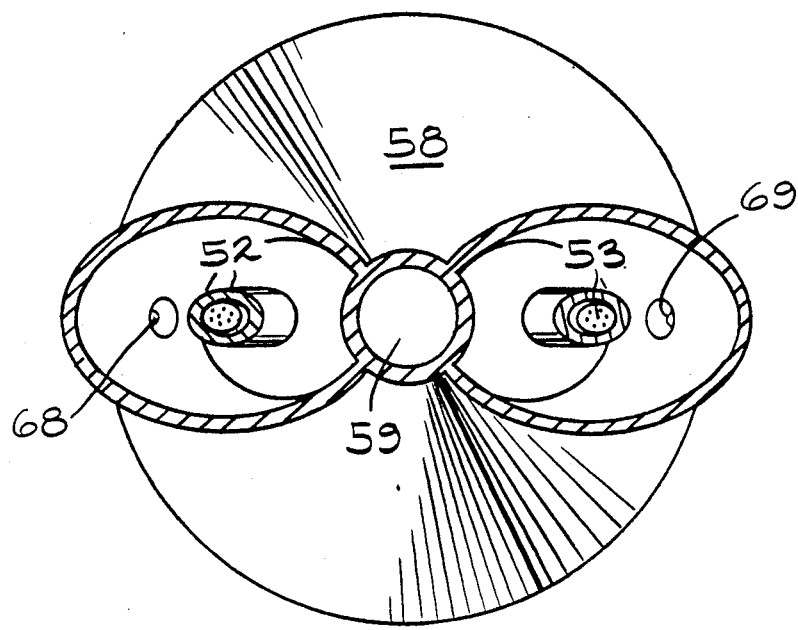
Figure 4B:
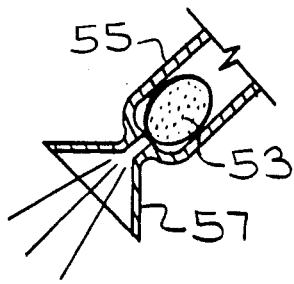

FIG. 4 is a schematic front, cross-sectional view of a preferred apparatus showing dual plasmas 52 and 53 adjacent nozzles 56 and 57 directed at a substrate 59 on an optionally heated support 60 inside a reaction chamber 58 and further showing sliding shorts 64 and 65 for positioning the plasmas 52 and 53 during operation of the apparatus. FIG. 4A is a cross-sectional view along line 4A—4A of FIG. 4. FIG. 4B is a view showing the positioning of the plasma 53 adjacent to the nozzle 57 by means of the sliding short 65.

Figure 5:
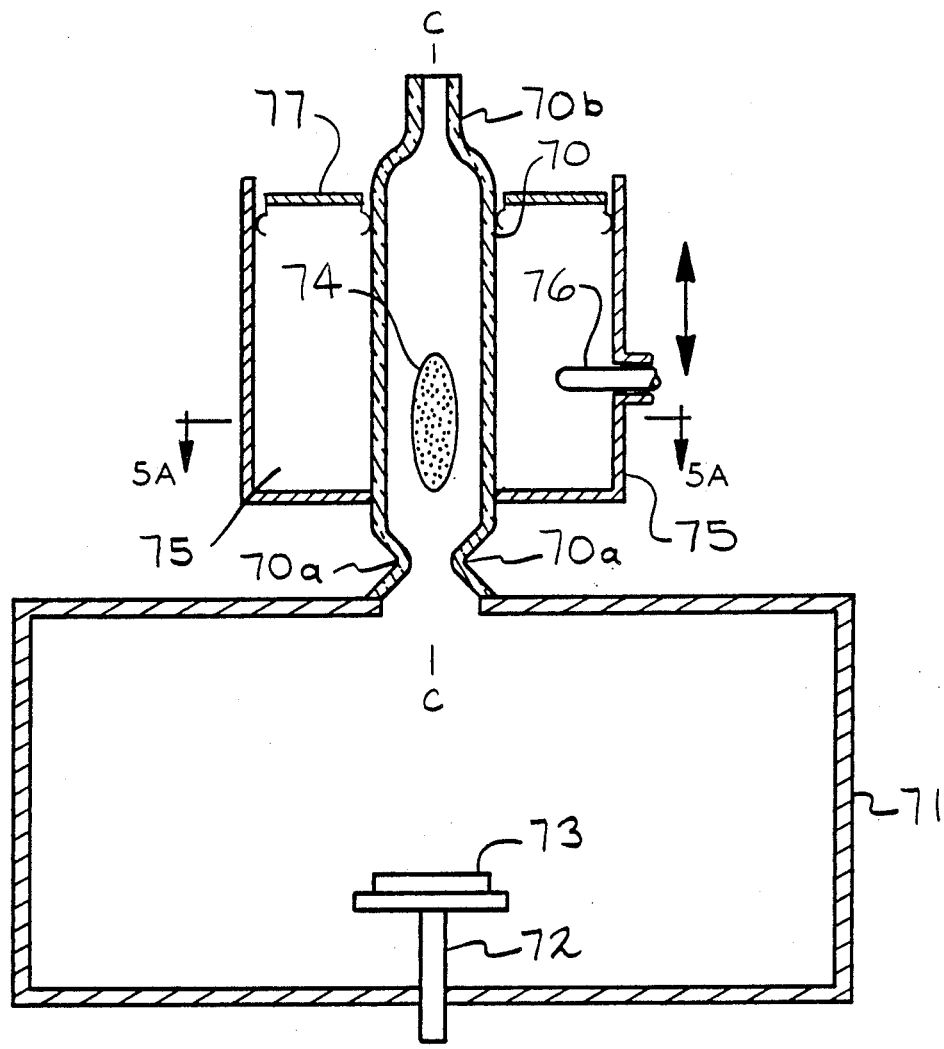
Figure 5A:
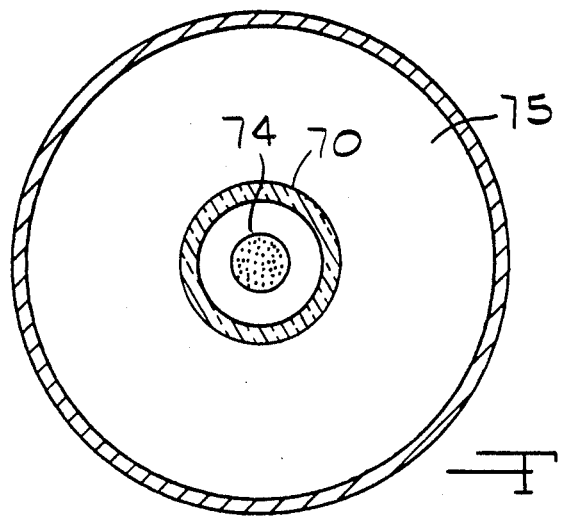
Figure 5B:
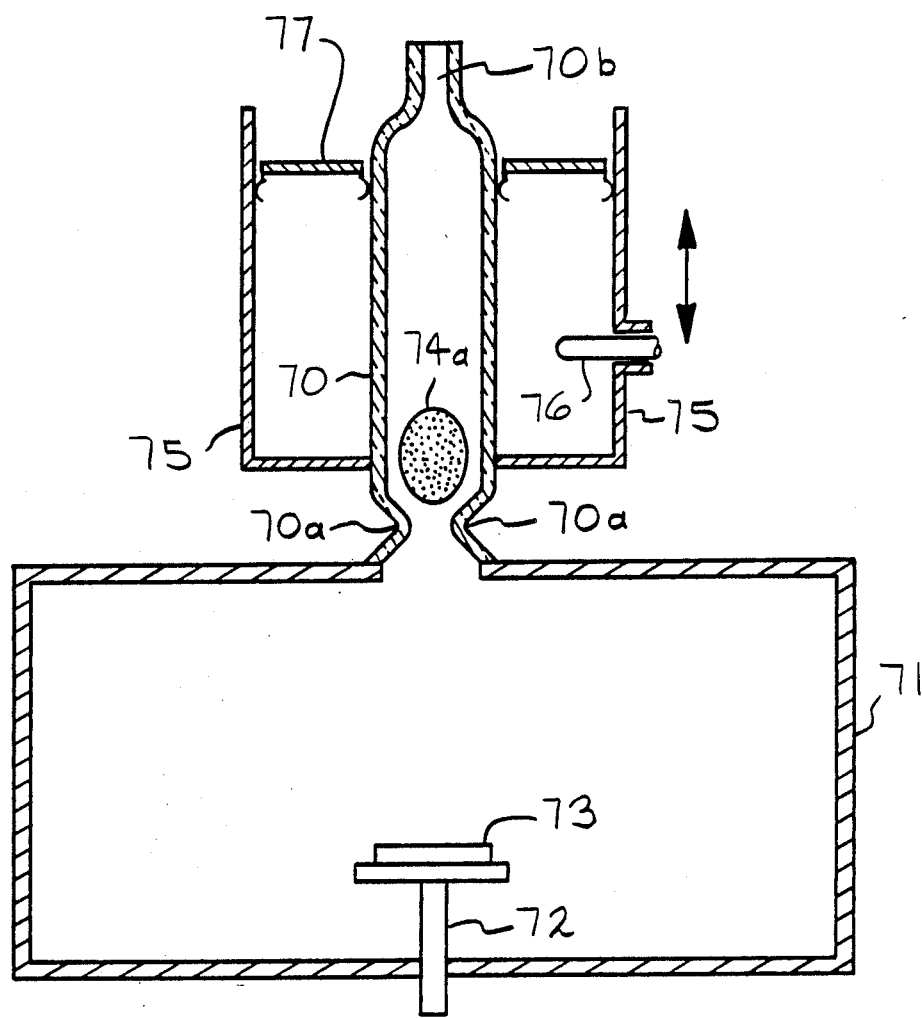

FIG. 5 is a schematic front cross-sectional view of an alternate type of plasma reactor apparatus wherein the cavity 75 is moveable along the axis c—c of a quartz tube 70 confining the plasma 74 in the $TM_{012}$ mode to position the plasma in the tube 70. FIG. 5A is a cross-section along line 5A—5A of FIG. 5. FIG. 5B shows the same thing as FIG. 5, except the plasma 74 in tube 70 is in the $TM_{011}$ mode with the discharge in the upper part of tube 70 suppressed.

Figure 6:
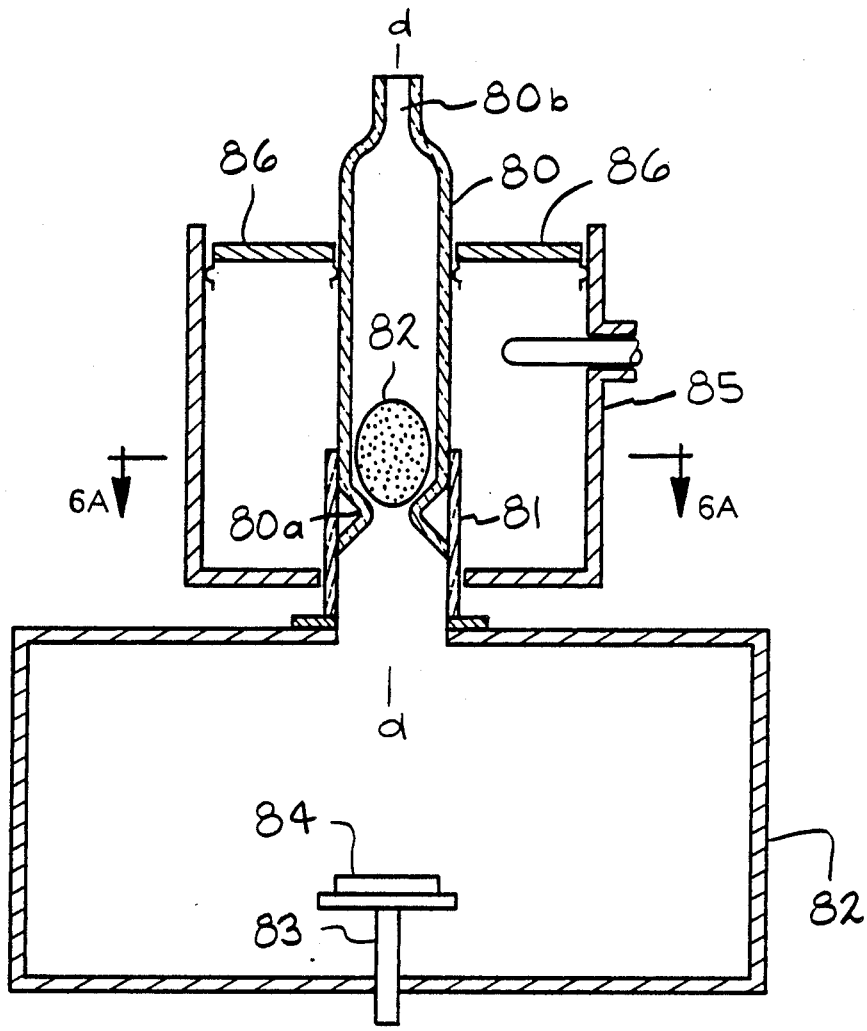
Figure 6A:
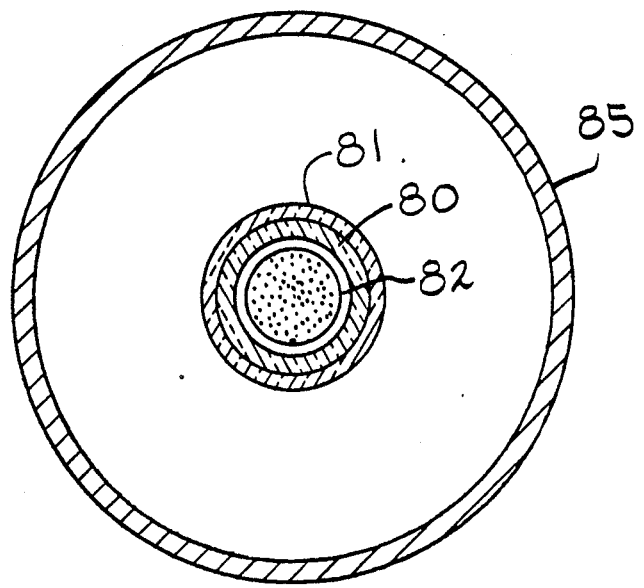

FIG. 6 is a schematic front cross-sectional view of an alternate type of plasma reactor apparatus wherein the tube 80 optionally slides in a quartz receiver 81 along axis d—d to position the plasma 82 in the tube 80 or the cavity 85 can be moved along the axis d—d. FIG. 6A is a cross-section along line 6A—6A of FIG. 6.

Figure 7:
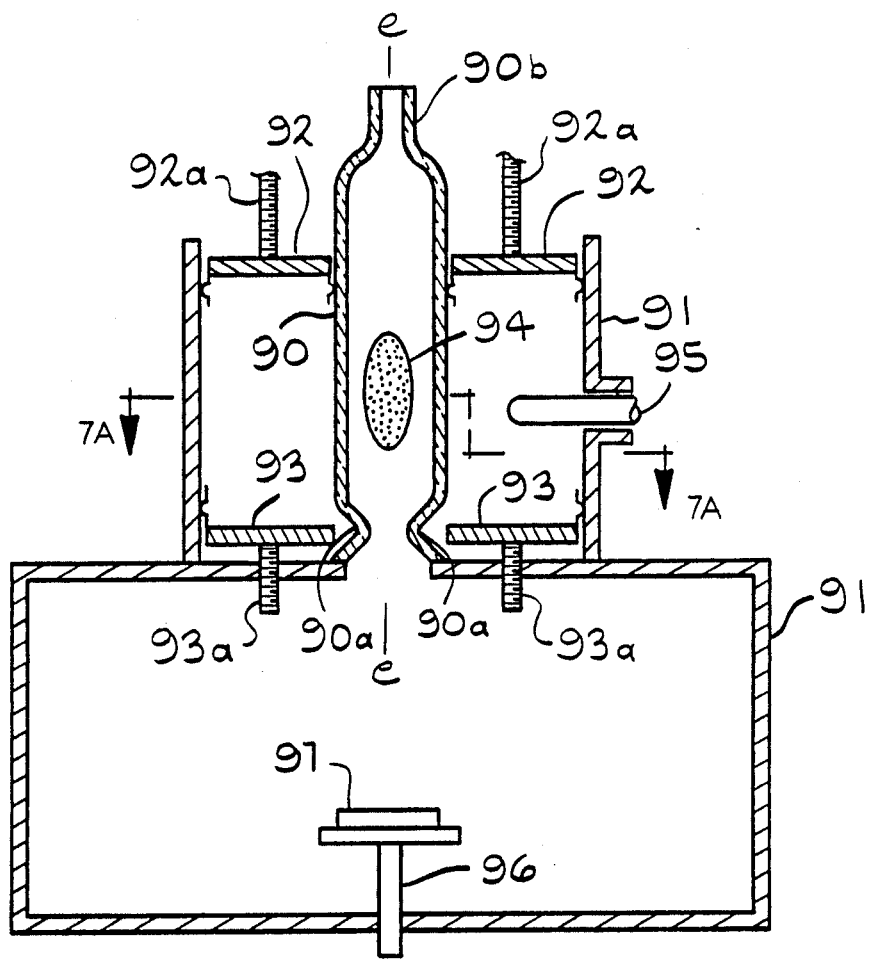
Figure 7A:
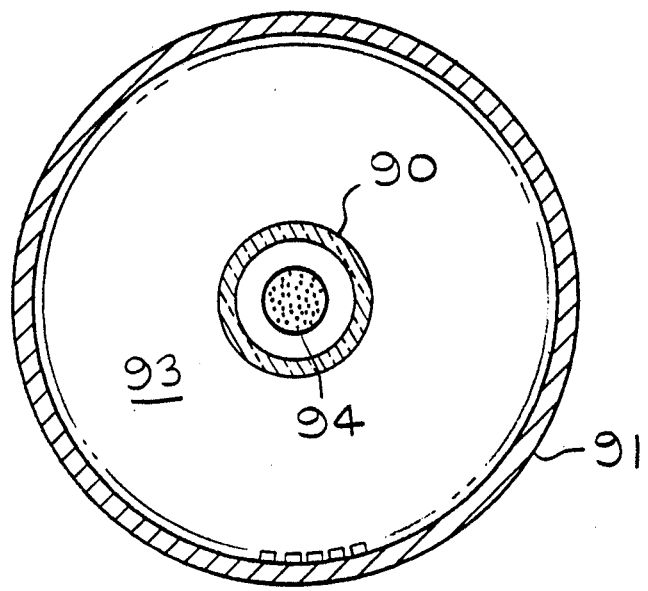

FIG. 7 is a schematic front cross-sectional view of another embodiment of a plasma reactor apparatus showing the dual sliding shorts 92 and 93 which position the plasma 94 in the tube 90. FIG. 7A is a cross-section along line 7A—7A of FIG. 7.

GENERAL DESCRIPTION

The present invention relates to an apparatus for applying a coating to a substrate, comprising: a plasma confining means with an aperture means leading from the plasma confining means; means for introducing a gas into the plasma confining means; means for exciting the plasma confining means with microwave energy to thereby produce a plasma discharge in the plasma confining means; means for adjusting the position of the discharge within the plasma confining means; and means for applying the plasma from the discharge through said aperture means from the plasma confining means to the substrate.

The present invention further relates to a reactor apparatus for exposing a substrate to excited species produced by an electrodeless plasma which comprises: reaction chamber means surrounding and providing a confined space around the substrate which is in the reaction chamber means; radiofrequency wave generating means mounted on the reaction chamber means including a metallic coupler means with a hollow cavity or waveguide for the radiofrequency waves and a tuning means, the coupler means having an opening defining a longitudinal axis directed at the substrate; plasma confining means having a space with a first cross-section between opposed ends in which the plasma is to be generated mounted in the coupler means around the longitudinal axis which is directed at the substrate with an inlet means into the confining means for a gas which is to be converted to a plasma; and aperture means having a second cross-section at one end of the confining means closest to the substrate which is smaller in cross-section than the first cross-section of the confining means and which restricts the flow of the excited species from the plasma into the reaction chamber means and onto the substrate wherein in operation of the apparatus the plasma is created in the space in the confining means and the excited species from the plasma passes through the aperture means into the chamber means and impinges on the substrate and wherein a plasma positioning means provided on the apparatus is used to position the plasma in the space in the plasma confining means during operation of the apparatus.

Further, the present invention relates to a method for exposing a substrate to excited species from an electrodeless plasma which comprises: providing an apparatus for exposing a substrate to excited species produced by a plasma which comprises: reaction chamber means surrounding and providing a confined space around the substrate which is in the reaction chamber means; radiofrequency wave generating means mounted on the reaction chamber means including a metallic coupler means with a hollow cavity or waveguide for the radiofrequency waves and a tuning means, the coupler means having an opening defining a longitudinal axis directed at the substrate; plasma confining means having a space with a first cross-section between opposed ends in which the plasma is to be generated mounted in the coupler means around the longitudinal axis which is directed at the substrate with an inlet means into the confining means for a gas which is to be converted to a plasma; and aperture means having a second cross-section at one end of the confining means closest to the substrate which is smaller in cross-section than the first cross-section of the confining means and which restricts the flow of the excited species from the plasma into the reaction chamber means and onto the substrate wherein in operation of the apparatus the plasma is created in the space in the confining means and the excited species from the plasma pass through the aperture means into the chamber means and impinge on the substrate; providing a gaseous material in the confining means from the inlet means so as to form the plasma; and exposing the substrate to the excited species from the aperture means, wherein a positioning means provided on the apparatus is used to position the place in the plasma in the space in the plasma confining means during operation of the apparatus.

The "positioning means" for positioning the plasma in the space in the confining means can be a sliding short in the cavity which also functions as a tuning means for the radiofrequency waves; a plasma confining means which is moveable relative to the coupler means or vice versa, and/or a means for varying the power level in the coupler means to change the size or configuration of the plasma. In this manner the plasma ball or disc can be positioned in the space in the plasma confining means as well as expanded or constricted in size. Preferably the plasma is positioned adjacent to the aperture means.

The plasma is formed in a high pressure region and the deposition occurs in a low pressure region. The apparatus and method allows a wide variation of experimental conditions, e.g. by varying the aperture means size and flow rate and input power, different combinations of discharge conditions and thus excited species and deposition conditions in the substrate can be achieved. The aperture means can be variable.

The term "excited species" means electrons and excited states of ions and free radicals. The excited species pass through the aperture and impinge upon the substrate to produce an affect on the substrate.

The term "aperture" includes any opening which restricts the cross-section of the confined space for creating the plasma leading into the chamber where the material is treated. The term "nozzle" means an aperture which has a constriction and directs the flow of the plasma into the chamber. For the purpose of the present invention any aperture can be used.

The substrate can be provided in the reaction chamber for deposition, etching, oxidation, and other surface treatment. The substrate can be on a support or could be particulate.

The substrate can be provided on a heated support. The support can be heated to temperatures between about 100° and 1000° C. The substrate can also be cooled.

The tuning means, coupler means and confining means can have a variety of configurations. One possible configuration is like the thruster described by Whitehair and Asmussen in *Applied Phys. Lett.* 10, 1014–1016 (1984).

SPECIFIC DESCRIPTION

FIGS. 1 and 1A show a microwave metallic cavity 10 with a metallic sliding short or plate 11 including metallic fingers 11a which contact cavity 10. A movable probe 12 is mounted in an inlet 10a to cavity 10. A bottom 10b of the cavity 10 supports a cylindrically shaped quartz closed end tube 13. Magnets 14 are optionally provided around the tube 13 to provide a means for confining and/or generating electron cyclotron resonance at low pressure (below about 100 millitorr) in a plasma 15. At low pressure the plasma fills tube 13. At high pressures the plasma takes on a disk or ball-shaped form as shown. The plasma 15 can also have the orientation shown by the dotted lines. A nozzle 16 (ceramic, such as quartz, or metallic) is provided so that the excited species from the plasma 15 can be directed towards a substrate 17 mounted on a holder or support 18. A radial gas filled conduit 19 is provided to inlet gas into the closed end tube 13. An annular ring 17a with holes 17b is provided to direct the inlet gases. An external coil or coils 20 can be provided around the cavity 10 to create or augment electron cyclotron resonance. The substrate 17 is provided in an enclosed space 21a in reaction chamber 21.

FIGS. 2 and 2A show a similar apparatus to that shown in FIG. 1 except that a quartz hemisphere 22 is used to confine the plasma 15a and there are no magnets.

FIGS. 3 and 3A show a waveguide applicator with external matching. A gas is provided at an inlet 30a of quartz tube 30 to be used to create a plasma 31. The tube 30 is provided with a nozzle 32 directed at a substrate 33 mounted on a holder or support 34. The substrate 33 is confined in a space 35a in reaction chamber 35. The plasma 31 is created in tube 30 by microwaves in the metallic waveguide 36 which has a metallic sliding short 37 with fingers 37a in contact with an inside surface 36a of waveguide 36. External matching stubs 38, 39 and 40 are provided in ports 37b, 37c and 37d on guide 36. The stubs 38, 39 and 40 and short 37 are used to tune the plasma loaded waveguide to a matched and resonant condition.

In FIGS. 1 to 3, the plasma excited species from the plasma 15, 15a or 31 passes through the nozzle 16 or 32 and onto the substrate 17 or 33 where a deposit is formed or where the surface is treated as by etching. The closed tube 13, hemisphere 22 or open tube 30 provide a higher pressure space 15b, 15c or 31a for the plasma 15, 15a or 31 to form. The reaction chamber 21 or 35 provides a lower pressure space 21a or 35a for the excited species passing through the nozzle 16 or 32. The sliding short 11 is one means which allows the plasma to be positioned in the tube 13, hemisphere 22 or open tube 30, preferably adjacent to the nozzle 16 or 32. The short 11 also allows tuning of the mode of the plasma. The detailed operation of the apparatus of FIG. 1 to 3 is described in further detail by reference to FIG. 4.

As depicted in FIGS. 4, 4a and 4b, the plasma reactor apparatus consists of two microwave discharge applicators 50 and 51. The applicator 50 includes a tube 54 which passes through a space 66a which confines a plasma 52 in cavity 66. The applicator 51 includes a tube 55 which confines plasma 53 which passes through a space 67a in cavity 67. Nozzles 56 and 57 are mounted on tubes 54 and 55, respectively. Slideable shorts 64 and 65 are mounted in the spaces 66a and 67a, respectively, to tune the microwave. Probes 68 and 69 are provided to couple the microwaves into the cavities 66a and 67a, respectively. Excited species from the plasmas 52 and 53 pass through the nozzles 56 and 57 into a common, lower pressure reaction chamber 58 and impinge upon a substrate 59 mounted on a support 60. Applicator 50 has an axis a—a and applicator 51 has an axis b—b directed at the substrate.

The applicators 50 and 51 couple microwave energy into a gas to form the plasmas 52 and 53. The high pressure discharge regions 61 and 62 and a low pressure reaction chamber 63 regions are separated by the nozzles 56 and 57. The apparatus produces excited species which pass into the reaction chamber 58 which quenches the excited species such that they do not recombine or de-excite until they reach the reaction surface or substrate 59. Thus the apparatus can be applied to a wide variety of deposition conditions ranging from low pressure molecular beam epitaxy (MBE)—like conditions to high pressure, high rate processes. A specific example of a microwave plasma jet deposition process is the formation of diamond films from methane and hydrogen wherein the hydrogen and methane are in separate applicators 50 and 51.

Input gas flows through the tubes 54 and 55 and into the high pressure regions 61 and 62 and then passes through the nozzles 56 and 57 into the lower pressure region 63. Microwave energy is efficiently coupled into the discharge via the tuned microwave applicators 50 and 51. The pressure differential between the high pressure regions 61 and 62 and low pressure region 63 depends on the nozzle 56 and 57 size, gas type, and gas flow rate. Since microwave plasmas 52 and 53 can be created in the applicators 50 and 51 over a very wide pressure range, gas flow rates vary from more than 10,000 sccm to less than one (1) sccm. The high flow rates produce a high pressure ($\frac{1}{2}$ to 2 atmospheres) plasma 52 or 53 while the very low flow rates produce a low pressure plasma 52 or 53 on the order of $10^{-3}$ Torr. Thus the apparatus can be employed over a wide range of deposition or reaction conditions. Thus a wide variety of excited species can be introduced into the reaction chamber 58.

Depending on the process, the pressure of the reaction chamber 58 can also be varied over a wide range of conditions. For example, if very low pressure deposition is desired, where the mean free paths of the excited species are long compared to the chamber 58 dimensions ("MBE like" conditions) then very low flow, small nozzles 56 or 57 are utilized and deposition pressures are of the order of $10^{-6}$ Torr or less. In this process, the diameter of the nozzles 56 or 57 is less than one (1) millimeter. If high deposition rates are desired, higher input gas flows and medium to high pressures (up to approximately one (1) atmosphere) in the reaction chamber 58 are required. By using nozzle 56 or 57 having diameters of 2 to 5 millimeters, discharge pressures can range from hundreds of Torr to approximately 2 atmospheres.

Preferably the plasma 52 and 53 in each applicator 50 and 51 is positioned adjacent the aperture so that the excited species (i.e. electrons, ions, and excited neutral species) leave the plasma and pass through nozzle 56 and 57 into the chamber 58. Furthermore, when the plasma discharge is placed immediately adjacent to the nozzle 57, as shown by FIG. 4B, all of the gas flowing through the tubes 54 and 55 will be excited by the plasmas 52 and 53. This prevents gas from flowing around the plasmas 52 and 53, thereby bypassing the excitation region of the plasmas 52 and 53 and exiting into the reaction chamber 58. With the plasma 52 or 53 in the position shown in FIG. 4B, a large number of free radicals are efficiently generated with relatively small amounts of microwave power. Excited species generated within the plasmas 52 and 53 are quickly quenched to a non-equilibrium composition as they rapidly pass into the lower pressure region 63 of the chamber 58.

FIG. 4 shows an arrangement where two applicators 50 and 51 inject excited species into the chamber 58 (such as from hydrogen and methane). However, it is also possible to add multiple gases (for example hydrogen and carbon containing compounds) into one applicator 50 or 51, or to use more than two applicators if more than two components are required for the deposition or to produce uniformity of deposition to increase deposition rate. A single component can be used in each applicator 50 and 51.

Preferably the axes a—a and b—b of the applicators 50 and 51 are about 45° to each other. The axes can be between 10° and 170° from each other.

Port means 58a with valve or closure means 58b can be provided in reaction chamber 58 for introducing gases alone or with particulate materials (not shown). The port means 58a with a valve 58b can also be positioned in the nozzle or adjacent to the nozzle (not shown). The substrate 59 and support 60 can be removed for this method or process.

For diamond thin films, pressures in the reaction chamber 58 greater than $10^{-6}$ torr are used, preferably between 20 torr and 1 atmosphere for high deposition rates. The pressure in the regions 61 and 62 is at least twice that in the reaction chamber 58 or about 40 torr to 2 atmospheres.

FIG. 5 shows a plasma reactor apparatus wherein a quartz tube 70 is mounted on a processing chamber 71 so as to provide a vacuum seal between the tube 70 and chamber 71. The chamber 71 includes a support 72 for a material 73 to be treated. The axis c—c of tube 70 is directed at the substrate 73. The tube 70 includes a nozzle 70a at one end and a gas inlet 70b at an opposite end. The tube 70 confines a plasma 74 which is excited in the cylindrical cavity $TM_{012}$ mode. The sliding short 77 determines the mode and the position of the plasma 74 in the tube 70. A metallic cavity 75 surrounds the tube 70 and is adjustable in position so that the plasma can be moved to pre-selected positions in the tube 70, preferably adjacent to the nozzle 70a during operation. A probe 76 is used to couple the radiofrequency waves in the cavity 75 and can be adjusted in position.

FIG. 5B shows the position of the plasma 74a when excited in the cylindrical cavity $TM_{011}$ mode and is otherwise identical to FIG. 5. The cavity 75 in each instance is mounted in order to slide on the tube 70. The cavity 75 can have a separate moveable support means (not shown).

FIGS. 6 and 6A show another plasma reactor apparatus wherein tube 80 is optionally slideably mounted in a quartz receiver 81 so that the position of plasma 82 relative to nozzle 80a can be charged. Also the cavity 85 can be moved relative to the tube 80. An o-ring (not shown) can be used between the outside of the tube 80 and the inside of the receiver 81. The tube 80 includes a gas inlet 80b. The receiver 81 is mounted in sealed relationship on processing chamber 82 which confines a holder 83 supporting a substrate 84 to be treated. The axis d—d of the tube 80 is directed at the substrate 84. A metallic cavity 85 is used to provide the radiofrequency waves and includes a sliding short 86 which determines the mode and the position of the plasma 82 in the tube 80. By moving the tube 80 in receiver 81, the position of the plasma 82 in tube 80 is determined, preferably adjacent to the nozzle 80a. A probe 87 is used to couple the radiofrequency waves into the cavity 85 and can be adjusted in position.

FIG. 7 shows a plasma reactor apparatus wherein a quartz tube 90 is mounted on a receiving chamber (shown in part). The tube 90 has a nozzle 90a and a gas inlet 90b. A metallic radiofrequency wave cavity 91 is provided around the tube 90 and two sliding shorts 92 and 93 are provided in the cavity to position the plasma 94 in the tube 90. Threaded members 92a and 93a are used to move the shorts 92 and 93, respectively. The shorts 92 and 93 provide a relatively easy means for positioning the plasma in the tube 90, preferably adjacent to the nozzle 90a. A probe 95 is used to couple the radiofrequency waves into the cavity 91 which can be adjusted in position. A holder 96 is used to support substrate 97. The axis e—e of the tube 90 is directed at a substrate 97.

The microwave plasma applicator of the present invention can be used in place of dc and rf plasma torches, jets, and thermal plasmas. These include chemical reactions such as nitrodation, production of fine powders, and refining of materials.

Fine particles can be fed into the plasma or into the reaction chamber. ("Generation and Behaviour of Fine Particles in Thermal Plasmas - a Review", R. M. Young and E. Pfender, Plasma Chemistry and Plasma Processing, 5, 1-31, 1985.) Some specific examples are:

(1) high quality powders from low cost materials. These powders are used in powder metallurgy, such as in the production of sintered ceramics. Examples are injecting alumina powder with irregular particle shape and size into the reaction chamber 58 and obtaining spheroidal alumina particles at the output.

(2) the decomposition of metallic ores and oxides. For example, zircon sand can be injected into the reaction chamber 58 and zircon (zirconium silicate) produced. Alumina is injected into plasmas and aluminum is obtained.

(3) introducing aluminum metal particles and adding ammonia to the reaction chamber 58, so that aluminum nitride is obtained. By injecting titanium tetrachloride into the reaction chamber 58, titanium dioxide can be produced which is a white pigment.

(4) Plasma/powder combinations for the production of nitrides, carbides, and borides in the reaction chamber 58.

The apparatus can also be used for surface treating metals, such as nitridation of titanium. ("Nitriding of Titanium with Plasma Jet Under Reduced Pressure", O. Matsumoto, et al., Plasma Chemistry and Plasma Processing, 4, 33–42, 1984.)

The plasma applicator can also be used for sputtering applications. In one instance a beam would impinge upon a target to remove particles which deposit on another surface. A particulate material could also be used for the target.

The plasma confining means are made from a material transparent to microwaves, but capable of withstanding high temperatures. Examples of suitable materials are quartz and boron nitride. Nozzles are made of materials which are the same as the plasma confining means or of materials which are not necessarily transparent to microwaves. Examples of the latter materials are stainless steel, graphite and copper.

It is intended that the foregoing description be only illustrative of the present invention and that the present invention be limited only by the hereinafter appended claims.

We claim:

1. A reactor apparatus for exposing a substrate to excited species produced by an electrodeless plasma which comprises:
   (a) reaction chamber means surrounding and providing a confined space around the substrate which is in the reaction chamber means;
   (b) radiofrequency wave generating means mounted on the reaction chamber means including a metallic coupler means with a hollow cavity or a waveguide for the radiofrequency waves and a tuning means, the coupler means having an opening defining a longitudinal axis directed at the substrate;
   (c) plasma confining means having a space with a first cross-section between opposed ends in which the plasma is to be generated mounted in the coupler means around the longitudinal axis which is directed at the substrate with an inlet means into the confining means for a gas which is to be converted to a plasma; and
   (d) aperture means having a second cross-section at one end of the confining means closest to the substrate which is smaller in cross-section than the first cross-section of the confining means and which restricts the flow of the excited species from the plasma into the reaction chamber means and onto the substrate wherein in operation of the apparatus the plasma is created in the space in the confining means and the excited species from the plasma passes through the aperture means into the chamber means and impinges on the substrate and wherein a plasma positioning means provided on the apparatus is used to position the plasma in the space in the plasma confining means during operation of the apparatus.

2. The apparatus of claim 1 wherein two or more of the radiofrequency wave generating means with the confining means and aperture means are mounted on the chamber means each with the longitudinal axis directed at the substrate which is mounted on a holder means.

3. The apparatus of claim 1 wherein the wave generating means can be adjusted in input power to the coupler means or waveguide and the inlet means can be adjusted in flow rate of the gas so as to vary the excited species which impinge on the substrate.

4. The apparatus of claim 2 wherein each of the wave generating means can be adjusted in input power and each of the inlet means can be adjusted as to flow rate of the gas so that different excited species can be produced at each aperture means.

5. The apparatus of claim 3 wherein there are two radiofrequency wave generating means and wherein the axes are at an angle between about 10° and 170° to each other and directed at the substrate.

6. The apparatus of claim 5 wherein the angle is 45°.

7. The apparatus of claim 1 wherein the aperture means is a nozzle means.

8. The apparatus of claim 1 wherein the confining means is a tube and the cross-section is circular.

9. The apparatus of claim 1 wherein port means is provided for introducing a particulate solid material as the substrate into the reaction chamber for treatment by the excited species.

10. The apparatus of claim 1 wherein the tuning means is inside the cavity.

11. The apparatus of claim 1 wherein the tuning means is external of the cavity or waveguide.

12. A method for exposing a substrate to excited species from an electrodeless plasma which comprises:
   (a) providing an apparatus for exposing a substrate to excited species produced by a plasma which comprises: reaction chamber means surrounding and providing a confined space around the substrate which is in the reaction chamber means; radiofrequency wave generating means mounted on the reaction chamber means including a metallic coupler means with a hollow cavity or a waveguide for the radiofrequency waves and a tuning means, the coupler means having an opening defining a longitudinal axis directed at the substrate; plasma confining means having a space with a first cross-section between opposed ends in which the plasma is to be generated mounted in the coupler means around the longitudinal axis which is directed at the substrate with an inlet means into the confining means for a gas which is to be converted to a plasma; and aperture means having a second cross-section at one end of the confining means closest to the substrate which is smaller in cross-section than the first cross-section of the confining means and which restricts the flow of the excited species from the plasma into the reaction chamber means and onto the substrate wherein in operation of the apparatus the plasma is created in the space in the confining means and the excited species from the plasma pass through the aperture means into the chamber means and impinge on the substrate;
   (b) providing a gaseous material in the confining means from the inlet means so as to form the plasma; and
   (c) exposing the substrate to the excited species from the aperture means, wherein a plasma positioning means provided on the apparatus is used to position the plasma in the space in the confining means during operation of the apparatus.

13. The method of claim 12 wherein a solid material formed from the excited species is deposited on the substrate, which is optionally heated or cooled.

14. The method of claim 12 wherein the substrate is etched by the excited species.

15. The method of claim 12 wherein two or more of the radiofrequency wave generating means with confining means and aperture means are mounted on the reaction chamber means each with the longitudinal axis directed at the substrate which is mounted on a holder means and wherein each of the wave generating means is operated simultaneously.

16. The method of claim 15 wherein a solid material formed from the excited species is deposited on the substrate.

17. The method of claim 16 wherein different gases are provided at each of the inlet means.

18. The method of claim 17 wherein there are two wave generating means and wherein hydrogen is provided at one inlet means and a carbon containing organic compound at the other inlet means and wherein the excited species are combined adjacent to the substrate to form a diamond or diamond-like film on the substrate.

19. The method of claim 18 wherein a first gas pressure in the confining means is at least twice a second gas pressure in the reaction chamber means.

20. The method of claim 19 wherein the gas pressure in the reaction chamber means is at least $10^{-6}$ torr.

21. The method of claim 12 wherein the pressure in the reaction chamber means is between about 20 torr and 1 atmosphere and wherein the pressure in the confining means is between about 40 torr and 2 atmospheres.

22. The method of claim 12 wherein a particulate solid material as the substrate is introduced into the reaction chamber so as to be treated by the excited species.

23. A reactor apparatus for the deposition of material from an excited species produced by a plasma onto a substrate which comprises:
(a) a holder means for supporting a substrate onto which the material is to be deposited;
(b) a reaction chamber means surrounding and supporting the holder means providing a confined space around the substrate;
(c) radiofrequency wave generating means mounted outside the chamber means including a metallic coupler means with a hollow cavity for confining the radiofrequency waves having a longitudinal axis directed at the substrate and a surface around the axis, a movable plate means closing the coupler means at one end which is movable perpendicular to the axis in contact with the surface of the cavity and other plate means closing the coupler at an opposite end of the cavity spaced from the movable plate means, the coupler means having at least one opening along the axis through one of the plate means;
(d) a confining means having a space with a first diameter in which the plasma is to be generated mounted in the coupler means along the axis which is directed at the substrate, with an inlet means into the confining means for a gas which is to be converted to a plasma; and
(e) nozzle means on the confining means having an opening smaller in diameter than the first tubular diameter which restricts the flow of the gaseous plasma from the confining means into the chamber means, wherein in use of the apparatus the plasma is positioned adjacent to the nozzle means by moving the movable plate means in the cavity so that the plasma is in the confining means adjacent to the nozzle means, the excited species from the plasma then pass through the nozzle means into the chamber means and impinge on the substrate, wherein the movable plate means is used to position the plasma in the space in the confining means during operation of the apparatus.

24. The apparatus of claim 23 wherein two or more of the radiofrequency wave generating means with confining means and nozzle means are mounted on the chamber means each mounted with the longitudinal axis directed at the substrate.

25. The apparatus of claim 23 wherein the wave generating means can be adjusted in input power to the coupler means and the inlet means can be adjusted as to flow rate of the gas so as to vary the excited species which impinge on the substrate.

26. The apparatus of claim 24 wherein the wave generating means can be adjusted in input power to the coupler means and the inlet means can be adjusted as to flow rate of the gas so as to vary the excited species which impinge on the substrate.

27. The apparatus of claim 24 wherein the chamber means has a cover means supporting the radiofrequency wave generating means so that the axis of the radiofrequency wave generating means are mounted at an angle between about 10° and 170° to each other and directed at the substrate.

28. The apparatus of claim 27 wherein the angle is about 45°.

29. The apparatus of claim 24 wherein there are two radiofrequency wave generating means each mounted on the chamber means with the axis directed at the substrate.

30. The apparatus of claim 29 wherein the two radiofrequency wave generating means have the axis at an angle of about 45° to each other and are directed at the substrate.

31. A method for depositing a material on a substrate from an excited species produced by a plasma which comprises:
(a) providing a reactor apparatus for the deposition of material on a substrate which comprises: a holder means for supporting a substrate onto which the material is to be deposited; a chamber means surrounding and supporting the holder means providing a confined space around the substrate; radiofrequency wave generating means mounted outside the chamber means including a metallic coupler means with a hollow cavity for confining the radiofrequency waves having a longitudinal axis directed at the substrate and a surface around the axis, a movable plate means closing the coupler means at one end which is movable perpendicular to the axis in contact with the surface of the cavity and other plate means closing the coupler at an opposite end of the cavity spaced from the movable plate means, the coupler means having at least one opening along the axis through one of the plate means; a confining means having a space with a first diameter in which the plasma is to be generated mounted in the coupler means along the axis which is directed at the substrate, with an inlet means into the confining means for a gas which is to be converted to a plasma; and nozzle means on the confining means having an opening smaller in diameter than the first diameter which restricts the flow of the gaseous plasma from the confining means into the chamber means, wherein in use of the apparatus the plasma is positioned adjacent to the nozzle means by moving the movable plate means in the cavity so that the plasma is in the confining means adjacent to the nozzle means, the excited species from the plasma then pass through the nozzle means into the chamber means and impinges on the substrate;

(b) providing a gaseous material in the confining means from the inlet means so as to form the plasma; and (c) exposing the substrate to the excited species from the plasma through the nozzle means so as to deposit the material on the substrate, wherein the movable plate means is used to position the plasma in the space in the confining means during operation of the apparatus.

32. The method of claim 31 wherein two or more of the radiofrequency wave generating means are mounted on the chamber means each mounted with the longitudinal axis directed at the substrate and wherein different gases are provided in each of the confining means from the inlet means so that the plasmas generated in each of the confining means are different and wherein the plasmas combine together at the substrate to deposit a solid material onto the substrate.

33. The method of claim 32 wherein there are two radiofrequency generating means, wherein a plasma of hydrogen as the gas is provided in one confining means and a plasma of a low molecular weight hydrocarbon as the gas is provided in the other confining means and wherein the solid material is a diamond or diamond-like film.

34. The method of claim 32 wherein the chamber means has a pressure of less than $10^{-6}$ torr and wherein the pressure in the inlet means is at least twice the pressure in the chamber means.

35. The method of claim 32 wherein the gas pressure in the confining means is at least twice a gas pressure in the chamber means and wherein the chamber means has the gas pressure between about 20 torr to 1 atmospheres and wherein the gas pressure at the inlet to the confining means is between about 40 torr and 2 atmospheres.

36. An apparatus for applying a coating to a substrate, comprising:

a plasma confining means with an aperture means leading from the plasma confining means;

means for introducing a gas into the plasma confining means;

means for exciting the plasma confining means with microwave energy to thereby produce a plasma discharge in the plasma confining means;

means for adjusting the position of the discharge within the plasma confining means; and means for applying the plasma from the discharge to the substrate.

37. The apparatus of claim 36 wherein the plasma confining means and the means for excitation of the plasma are moveable relative to each other.

38. The apparatus of claim 36 wherein more than one of the means for adjusting the position of the plasma are provided for adjusting the position of the plasma in the plasma confining means.

* * * * *